US005119260A

United States Patent [19]

Huhse et al.

[11] Patent Number: 5,119,260

[45] Date of Patent: Jun. 2, 1992

[54] METHOD FOR OPERATING A CIRCUIT-BREAKER

[75] Inventors: Peter Huhse; Horst Kopplin, both of Berlin; Josef Trott, Niederndorf; Joachim Niewisch, Nuremberg, all of Fed. Rep. of Germany

[73] Assignee: Siemens Aktiengesellschaft, Munich and Berlin, Fed. Rep. of Germany

[21] Appl. No.: 483,361

[22] Filed: Feb. 22, 1990

[30] Foreign Application Priority Data

Feb. 22, 1989 [DE] Fed. Rep. of Germany ....... 3905822

[51] Int. Cl.[5] ........................ H02H 3/00; H02H 7/00; G01R 19/00

[52] U.S. Cl. .......................................... 361/2; 361/5; 361/78; 361/88; 361/93; 364/483

[58] Field of Search .................... 200/144 B; 361/2-8, 361/86, 87, 93-98, 115, 116, 88-92; 307/106, 138, 64; 364/483

[56] References Cited

U.S. PATENT DOCUMENTS

| | | | |
|---|---|---|---|
| 3,530,303 | 9/1970 | Bachofen | 307/106 |
| 3,555,354 | 1/1971 | Kotos | 361/5 |
| 3,707,634 | 12/1972 | Arlen et al. | 307/138 |
| 3,946,277 | 3/1976 | Lange et al. | 361/5 |
| 4,152,562 | 5/1979 | Kohler et al. | 200/400 |
| 4,922,363 | 5/1990 | Long et al. | 361/2 X |
| 4,937,698 | 6/1990 | Toya et al. | 361/2 X |

FOREIGN PATENT DOCUMENTS

| | | |
|---|---|---|
| 1147839 | 6/1983 | Canada . |
| 0222727 | 5/1987 | European Pat. Off. . |
| 2717958 | 6/1979 | Fed. Rep. of Germany . |
| 2854092 | 10/1987 | Fed. Rep. of Germany . |
| 0144328 | 10/1980 | German Democratic Rep. . |
| 0248903 | 8/1987 | German Democratic Rep. . |
| 2069762 | 8/1961 | United Kingdom . |

OTHER PUBLICATIONS

Afanasjew, W. W.; Greiner, L. K.: *Neue Entwicklungsrichtungen im Hochspannungsgeraetebau,* Elektrie 24, (1970), H.12, pp. U239-U240.

*Primary Examiner*—J. R. Scott
*Attorney, Agent, or Firm*—Kenyon & Kenyon

[57] ABSTRACT

A method for operating a circuit-breaker by means of which one is able by using a vacuum circuit-breaker, to interrupt inductive circuits without causing disturbing overvoltages. The switching operation of the vacuum circuit-breaker is influenced by a tripping control device, which is supplied with a measured value of the tripping delay of the vacuum circuit-breaker from the instant the tripping signal is output to the instant the contact members are separated as a correcting quantity, in the case of an opening operation that occurred previously. The temperature of the actuator unit of the vacuum circuit-breaker, the standstill time of the circuit-breaker, as well as the operating voltage and temperature of a tripping solenoid can be used as further correcting quantities. The described method is suited for application vacuum circuit-breakers in circuits with inductive components.

13 Claims, 4 Drawing Sheets

METHOD FOR OPERATING A CIRCUIT-BREAKER

BACKGROUND OF THE INVENTION

The present invention relates to a method for operating a circuit-breaker, in particular, a vacuum circuit-breaker, using a tripping control device, which independently from the instant that a breaking command is given, initiates the separation or opening of the contact members at an instant which is fixed relative to the zero crossing of the current.

A method of this type has become known from the teachings of U.S. Pat. No. 3,555,354, for example. The aim of this method is to limit, to the greatest extent possible, the duration of the arcing between the contacts of the circuit-breaker and, on the other hand, to ensure a sufficient clearance between open contacts at the instant of current zero crossing. For this purpose, via a transformer, the tripping control device detects the flowing current and acquires periodic pulses from it, respectively, at the zero crossing of the current and at the maximum or minimum of the current waveform. Both pulses are fed via a timer to an AND element, which in addition can receive a signal derived from the absolute level of the current. In a conventional way, the tripping signal output by the AND element operates a tripping solenoid, which actuates a valve or a latching arrangement to release the tripping mechanism or the breaker mechanism.

In the same way as certain gas-blast circuit-breakers, vacuum circuit-breakers have the property whereby after a current interruption, their contact-break distances attain a high dielectric strength in an extremely short period of time. Therefore, especially in strongly inductive circuits, they tend to have so-called multiple re-ignitions, which represent a rapid succession of arcing occurrences between the opened contact members. High overvoltages can be associated with this process. Moreover, in three-phase systems, due to multiple re-ignitions in the first-quenching electric pole of the circuit- breaker, a virtual current chopping can occur in the last quenching electric poles of the circuit-breaker, through which means overvoltages are likewise produced.

To avoid such overvoltages, attempts have already been made to insert contact materials in vacuum circuit-breakers. Due to the relatively high vapor pressures of individual components, these contact materials sustain an arc as close to the zero crossing of the current as possible. However, opposing this advantageous property is a reduced capability for high switching capacities. The result is that it is difficult to produce a circuit-breaker, which is suited for high switching capacities and, at the same time, avoids the formation of overvoltages.

Furthermore, it is generally known to avoid overvoltages which occur, particularly when actuating motor circuits, by means of voltage surge protectors or combinations of resistors, capacitors and inductors with similar properties. Apart from the difficulty of accommodating such elements at a location in a circuit arrangement suitable to ensure their effectiveness, these components must also be individually adapted to the properties of the respective circuit at hand.

A switching method is known with the aim of avoiding the difficulties described in the preceding, whereby two of the contact-break distances of a three-pole circuit-breaker are opened later than the first contact-break distance; that is later by at least one third of a cycle of the mains frequency plus the minimal arcing time in the first contact-break distance (DE- C-28 54 092). This method in principle prevents the occurrence of the so-called virtual current chopping in the two last-quenching electric poles of the circuit-breaker. Due to the fact that the switching operation can begin at any instant, the multiple re- ignitions in the first-quenching electric pole, which likewise are the cause of overvoltages, are not able to be prevented.

If a circuit-breaker is operated with the application of a tripping control device, then in principle it is possible for one to undertake switching operations without overvoltages in three-phase systems. These switching operations are possible when in the case of the controlling system, a clearance exists between the contact members at the time of the current zero crossing of all electric poles of the circuit-breaker, said that the arc cannot ignite again under the influence of the transient recovery voltage. Such a switching method proves to be extremely difficult to implement, because the so-called opening window, that is the time interval in which the contact members must be opened, only has a range of 2 ms in a mains with a frequency of 50 Hz. Conventional circuit-breakers are not able to execute an opening operation with such precision. Moreover, the mechanical properties of circuit-breakers can change during their utilization period to the extent that after a long operating period and altered environmental conditions, the circuit-breakers are no longer capable of maintaining the opening window, even if they had originally been suited for this when new.

SUMMARY OF THE INVENTION

It is an object of the invention to provide a method for operating a circuit-breaker, so that property changes occurring during the utilization period of a circuit-breaker are automatically allowed for and, by this means, the opening window can be maintained even after a long operating period.

The above and other objects of the invention are achieved by a method for operating a circuit-breaker, in particular a vacuum circuit-breaker, with the application of a tripping control device, which independently from the instant that a break command is given, initiates the opening of the contact members at an instant which is fixed relative to the zero crossing of the current, further comprising supplying a measured value of the circuit-breaker's tripping delay from the instant the tripping signal is output to the instant the contact members are separated, in the case of a breaking operation that has occurred previously, as a correcting quantity to the tripping control device.

The tripping delay namely represents the result of a whole series of mechanical influences, which by themselves can only be detected with difficulty. In comparison, with relatively little effort, the tripping delay is able to be determined accurately enough in a different manner. Thus, it has been made possible to carry out a control free of overvoltages, particularly for motor circuits and inductors with vacuum circuit-breakers, with an economically justifiable expenditure.

To implement the new method within the scope of the invention, a circuit-breaker is suited, which has an assigned measuring device to determine the tripping delay. This measuring device is set in operation upon receipt of a tripping signal and stopped upon separation of the contact members. A storage device is also provided, which stores the measured value of the tripping delay at least until the next breaking operation. Although as a correcting quantity for the control of the circuit-breaker one uses a tripping delay, which is possibly derived from a breaking operation that occurred already some time ago, it nevertheless turns out that this procedure is suitable, and that relatively narrow opening windows apply during the breaking operation.

Evaluators which function electrically as well as electromechanically or electronically-mechanically are suited to measure the tripping delay. Particularly in the case of a switching current, the occurrence of an arc between the contact members can be used as a criterion for the contact separation.

In place of the measuring device explained above or in addition to it, the evaluator which detects the contact opening can contain a circuit to measure the capacitance between the contact members. This measuring method also operates in a contact-free manner and thus does not require any changes on the contact system itself.

However, it is also possible to determine directly the instant of the contact opening, to be determined in order to detect the tripping delay, from the relative movement of the contact members. For this purpose, a driving element connected directly to a movable contact member can be provided with a reflector, and an optical waveguide can be permanently mounted opposite this reflector with minimal clearance. At its end turned away from the reflector, the optical waveguide interacts with a light source and a receiving circuit arrangement for reflected light.

As already explained above, when the tripping delay is measured, a multitude of associated influence quantities are already accounted for in the mechanical sequence of the switching operation. However, one has to be prepared for the fact that a circuit-breaker, for example, is exposed at its installation site to greatly varying temperatures. Thus, the one-time detected tripping delay quantity cannot prove to be exact enough for the control of the circuit-breaker. In this case, it can be advantageous to feed the temperature of the driving mechanism of the circuit-breaker as a further correcting quantity to the tripping control device. This can be accomplished in a relatively simple way by placing a temperature sensor in the actuator housing. Now if the effect of the temperature on the tripping delay is determined in a series of tests, the probable positive or negative deviation from the standard value can then be determined by assigning the respective existing temperature to a standard value of the tripping delay.

The time that has elapsed since the last switching action constitutes an additional criterion for the mechanical sequence of the switching operation. In principle, a circuit-breaker used on a regular basis is more likely to retain the one-time determined value of the tripping delay than is a circuit-breaker operated only rarely or possibly only in intervals of months or years. This influence can be allowed for by applying a suitable correcting quantity. For this purpose, the time that has passed since the last switching action can be measured. In this case as well, one establishes through testing, how the tripping delay changes, starting from a standard value as a function of the standstill time.

The switching mechanisms in circuit-breakers are generally released by means of a solenoid fed by an auxiliary supply system. Since the voltage of this auxiliary supply system can fluctuate and the response rate of the tripping solenoid is dependent on it, the value of the supply voltage of the tripping solenoid also has a direct influence on the tripping delay. According to a further development of the invention, this influence can also be allowed for by feeding the supply voltage of the tripping solenoid to the tripping control device to obtain a further correcting quantity. In the same way, the temperature of the winding of the tripping solenoid can be determined, since the resistance and thus, when voltage is present, the current flowing through the winding depend on this.

All of the mentioned measured values or correcting quantities can be expediently fed to a real-time microprocessor. By comparing them to measured values or standard values retrieved from a storage device, this real-time microprocessor prepares a tripping signal for the circuit-breaker. In connection with this, threshold elements can be provided, which produce an instantaneous tripping when a lower limiting value of the current is undershot or when an upper limiting value of the current is exceeded.

BRIEF DESCRIPTION OF THE DRAWINGS

The invention will be described in greater detail in the following detailed description with reference to the drawings, in which.

DETAILED DESCRIPTION

Figure 1:
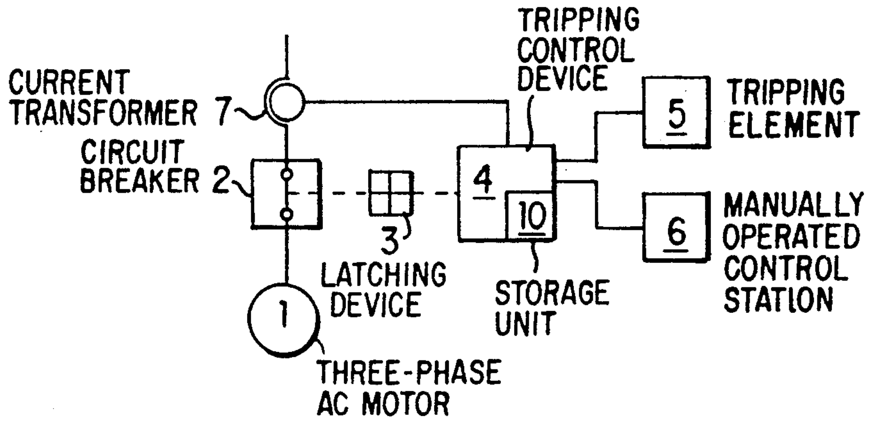
FIG. 1 is a block diagram of the fundamental configuration of the components of a circuit-breaker.

In FIG. 1, a three-phase AC motor 1 is shown, which can be switched on and off by means of a three-pole vacuum circuit-breaker 2. Marked with the symbol for a breaker mechanism is a latching device 3, which is responsible for releasing the switching contacts of the circuit-breaker 2 for the breaking operation. The latching device 3 can only be actuated by means of a tripping control device 4, which is responsive to a tripping element 5 or a manually operated control station 6. Current-dependent signals obtained at the current transformers 7 are fed to the tripping control device 4.

The tripping control device 4 contains a storage unit 10, which is provided to store at least one measured value for the tripping delay of the circuit-breaker 2 in the case of the breaking operation which had occurred previously. Moreover, the storage unit 10 can be designed so that it can receive both additional measured values of the tripping delay from earlier switching operations as well as additional variables, which are important for the mechanical operation and functional sequence of the switching operation.

Figure 2:
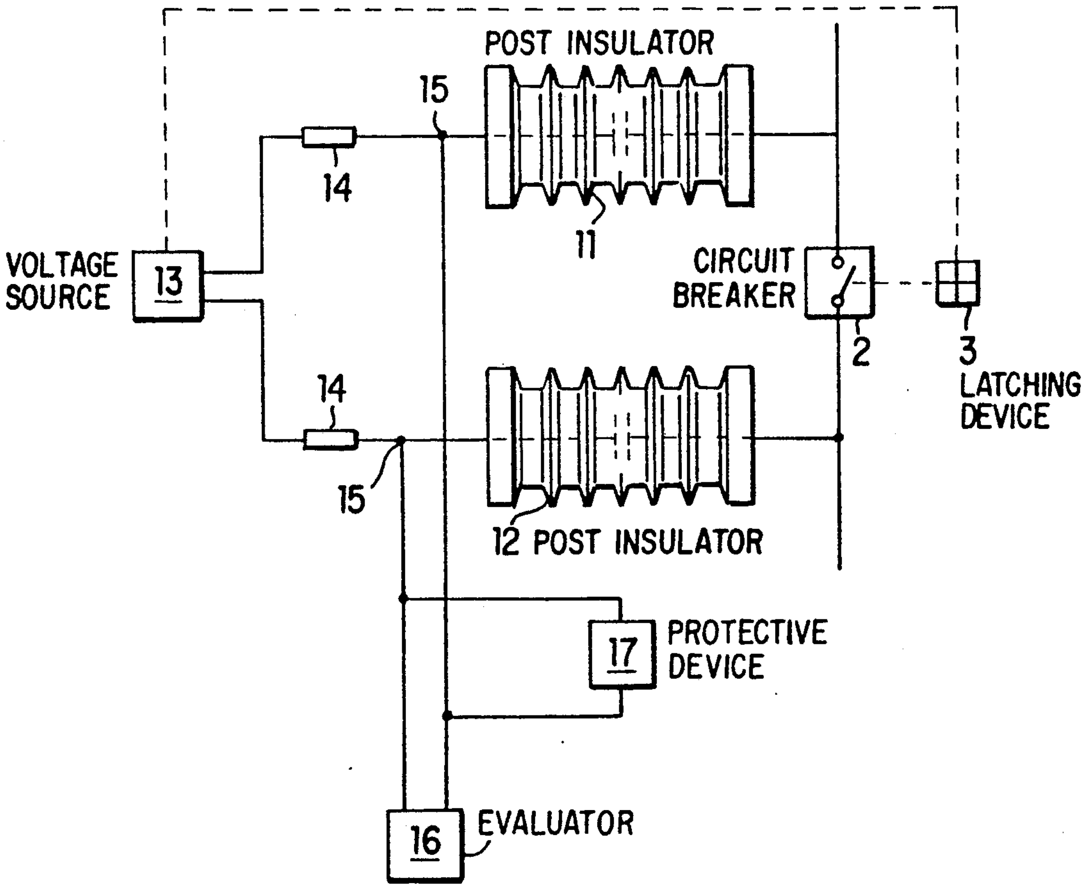
FIG. 2 is a simplified view of an arrangement for measuring the tripping delay, where the change in the capacitance of contact members is evaluated upon their separation.

An example is shown in FIG. 2 of the measuring of the instant that the contact members of the circuit-breaker 2 open. A high-frequency measuring voltage from a voltage source 13 is applied to the contact-break distance of the circuit breaker 2 via protective resistors 14 and post insulators 11 and 12, whose self-capacitance is depicted by a dotted line with the symbol for a capacitor. A voltage with a frequency of 5 MHz is suited, for example. A high-frequency voltage is picked off at the terminals 15 for evaluation. In the time lapse of this high-frequency voltage, a characteristic sudden change develops as a result of the change in the capacitance of the measuring circuit due to the opening of the contact members of the circuit-breaker 2. To aid the understanding of this operation, it is mentioned here that the contact members of a vacuum circuit-breaker have flat contact surfaces having either a circular or an annular shape. While there is no capacitance in the closed state of the contact members, such capacitance does develop through the formation of a plate-type capacitor, as soon as the contact members separate from each other. An evaluator 16 provided with a protective device 17 evaluates how this capacitance is brought into the measuring circuit by making a comparison with the instant that the latching device 3 is released. The evaluator 16 then determines the tripping delay of the circuit-breaker 2.

Figure 3:
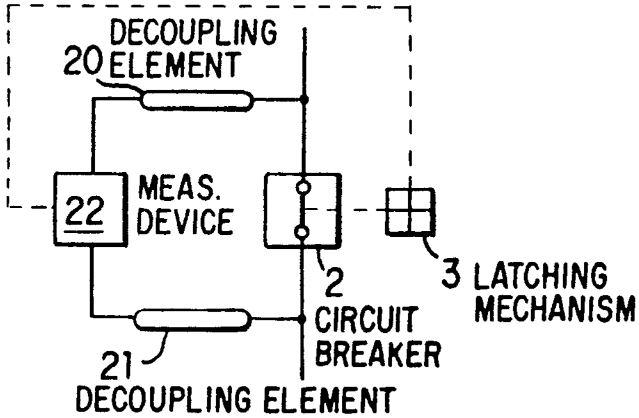
FIG. 3 illustrates the principle, whereby the instant the contact members separate is determined by means of the arc voltage.

A further example showing the measurement of the tripping delay of the circuit-breaker 2 is schematically depicted in FIG. 3. In this case, the voltage applied to the contact-break distance of the circuit breaker 2 is fed to a measuring device 22 by means of suitable decoupling separative elements 20 and 21, which, for example, can be opto-electronic devices. This measuring device 22 thus receives the voltage signal "0", when the contact members of the circuit- breaker 2 are closed, and receives a voltage signal corresponding to the arc voltage, when the contact members of the circuit-breaker 2 are opened in the case of a flowing current. The tripping delay of the circuit-breaker 2 is obtained by comparing the instant when this arc voltage occurs to the instant when the latching mechanism 3 is released. The comparison of the mentioned instants is indicated by the dotted-line connection between the latching mechanism 3 and the measuring device 22.

Figure 4:
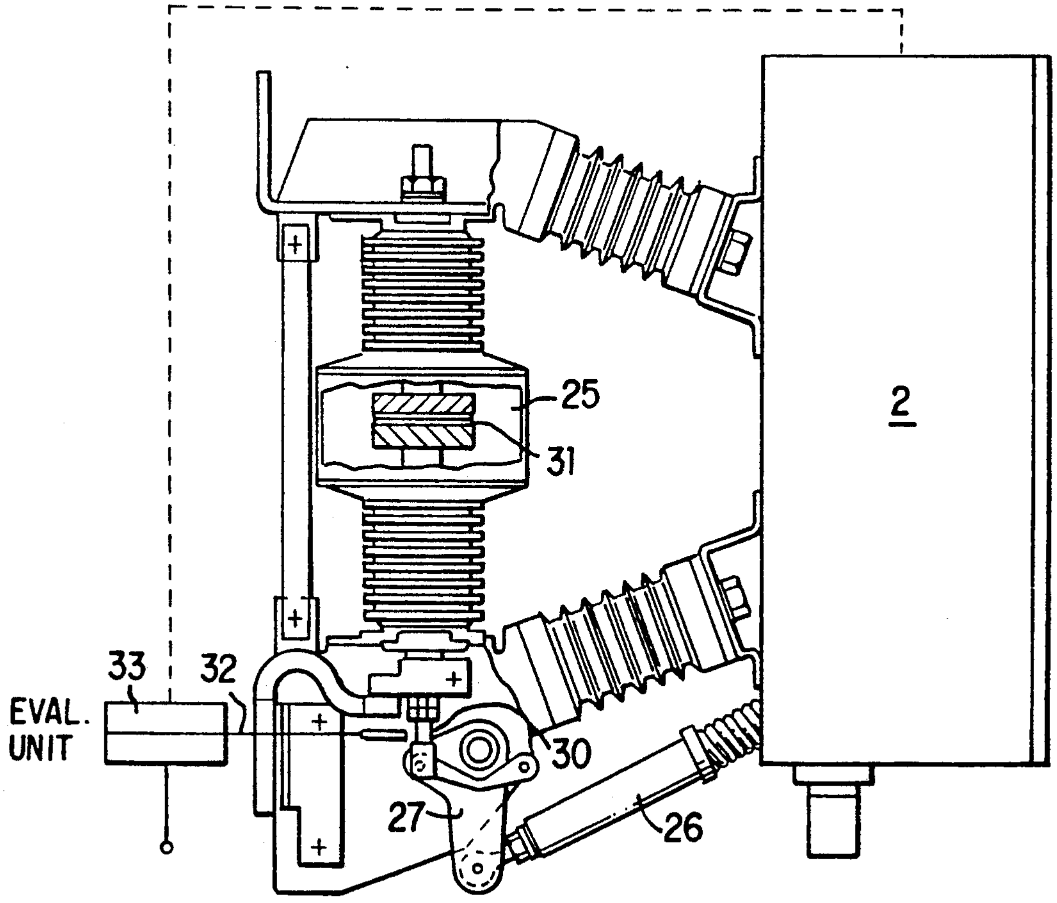
FIG. 4 shows the configuration of an opto-electronic measuring device for determining the separation of the contact members.

While the devices clarified based on FIGS. 2 and 3 measure the tripping delay using electrical means, one can also consider measuring with opto-electronic means. This type of measurement has the advantage of requiring no extra work for the electrical isolation between the high voltage on the circuit-breaker and the measuring device. This measuring method is clarified based on FIG. 4. This FIG. shows partially in cross-section a vacuum circuit-breaker of the known type of construction (compare DE-B- 27 17 958), whose vacuum interrupters 25 can be actuated by means of an isolating actuating rod 26. These actuating rods engage via an angle lever 27 with a linearly displaceable bearing bolt 30 of the movable contact member 31. If, for example, this bearing bolt is provided with a reflecting marking and a sensor is mounted opposite this marking, any movement of the bearing bolt and thus of the contact member 31 can then be established. For this purpose, it is indicated in FIG. 4 that the supply of the light and the return path of the reflection takes place through an optical waveguide 32, which is connected to an evaluation unit 33 comprised of a transmitter and receiver. The evaluation unit 33 on the other hand calculates the tripping delay by comparing the instant the bearing bolt 30 moves to the instant the latching device is released in the actuator unit of the circuit-breaker 2. The evaluation unit 33 can be integrated in the tripping control device 4 (FIG. 1).

Figure 5:
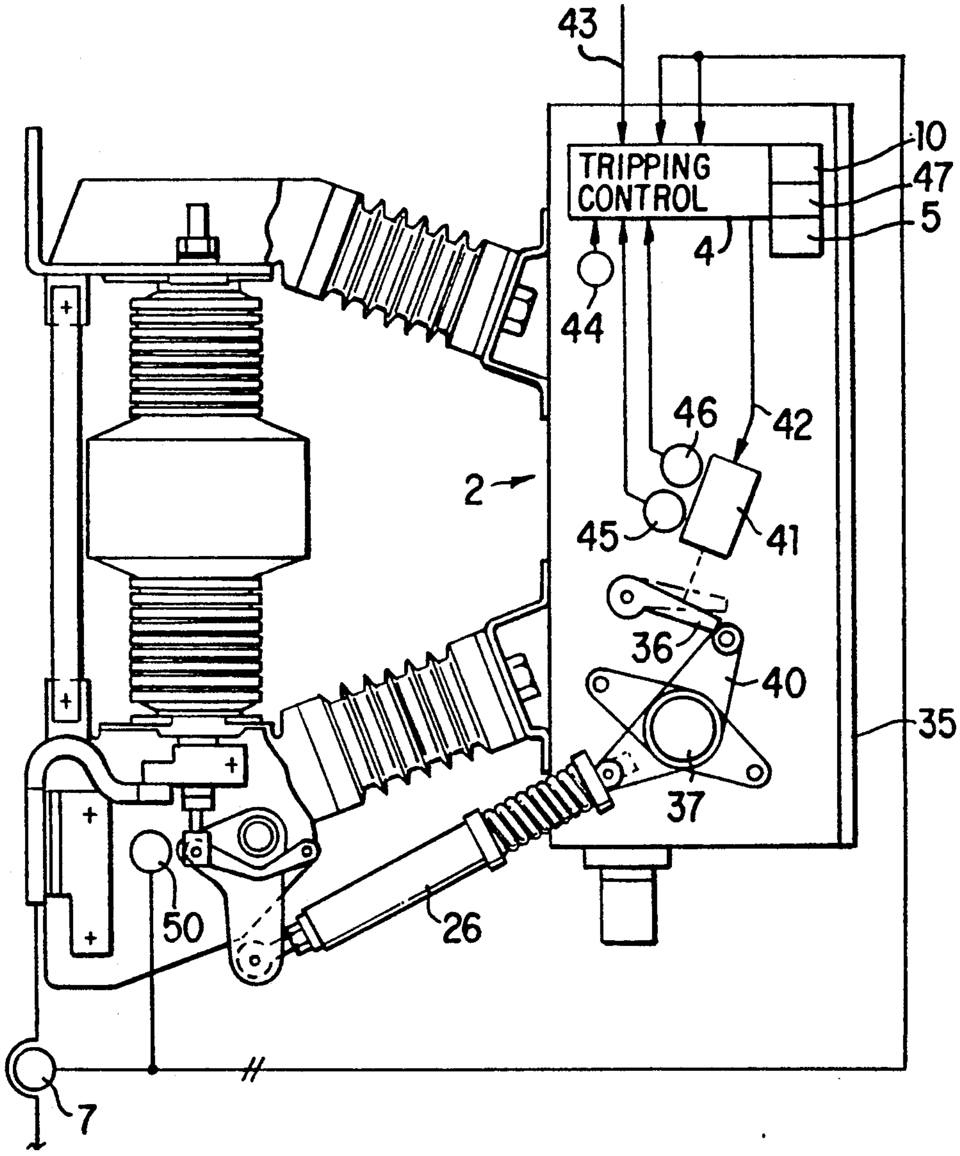
FIG. 5 schematically depicts an actuator unit of a vacuum circuit-breaker with a tripping control device, to which alternatively one or several correcting quantities can be fed.

A vacuum circuit-breaker 2 similar to that of FIG. 4 is depicted partially in cross-section in FIG. 5. It has a tripping control device 4 as well as sensors 43 for influences, which can affect the tripping delay. The tripping control device 4 is housed in the actuator unit 35 of the circuit-breaker 2. In the closed position, the vacuum interrupter 25 is retained by a latch 36, which engages with one end of a two-armed lever 40 resting on an actuating shaft 37. As already explained based on FIG. 4, the movable contact member 31 is operated by means of an actuating rod 26 as well as an angle lever. In the depicted closing position, the actuating shaft 37 is blocked by means of the two-armed lever 40 and the latch 36 against a rotation in the direction of the breaking operation.

The latch 36 is movable by means of a tripping solenoid 41 into the breaking position shown with a dashed line, where the actuating shaft 37 is released for the breaking operation. By means of tripping springs not shown, the actuating shaft 37 is then turned in a counter-clockwise direction and the actuating rod 26 is taken along. The tripping solenoid 41, as indicated by an arrow 42, is then to be actuated by the tripping control device 4. This is done when a breaking operation is requested by means of the tripping element 5 or by means of a manually entered command (arrow 42), and the tripping control device 4 has determined the instant suited for this. For this purpose, the tripping control device 4 first determines the instants of the following current zero crossings based on the measured values transmitted by the current transformers 7. The tripping command is now relayed to the tripping solenoids 41 while allowing for the value of the tripping delay stored in the tripping control device 4 in the case of a previous breaking operation and also allowing for additional variables made available by sensors 43. Appropriate for this purpose is a temperature transmitter 44 for the temperature present in the actuator unit of the circuit-breaker 2 as well as a further temperature transmitter 45 for the temperature of the winding of the tripping solenoid 41. Furthermore, the voltage which supplies the tripping magnet 41 is detected by means of an additional sensor 46. To correct the tripping delay, a timer 47, as a component of the tripping control device 4, provides the time that elapsed since the last breaking action.

According to the results obtained for a specific circuit-breaker, all of the mentioned sensors or only some of them can be used. For example, if a circuit-breaker is exposed to only small temperature changes, then the influence of temperature on the condition of the switching mechanics can be disregarded and the sensor 44 thus becomes superfluous.

The tripping delay is once more determined for the then following breaking operation by means of a sensor 50 and input in the tripping control device to be compared with the value of the tripping delay found in the storage device 10 of the control tripping device 4. The previous storage value can either be thereby replaced by the new measured value, or else the new measured value can also be stored to establish the change in the tripping delay over the course of several switching operations and, by extrapolating the stored measured values, to calculate the respective tripping delay to be expected with the greatest possible probability.

The tripping solenoid 41 can be both an open-circuit shunt release as well as an undervoltage opening release. Since undervoltage opening release units work according to the holding magnet principle, a higher response rate is generally able to be achieved than is possible with an open-circuit shunt release unit. However, it depends on the interaction between the tripping solenoid and the switching mechanism at hand, if the one or the other type of magnet is better suited.

Figure 6:
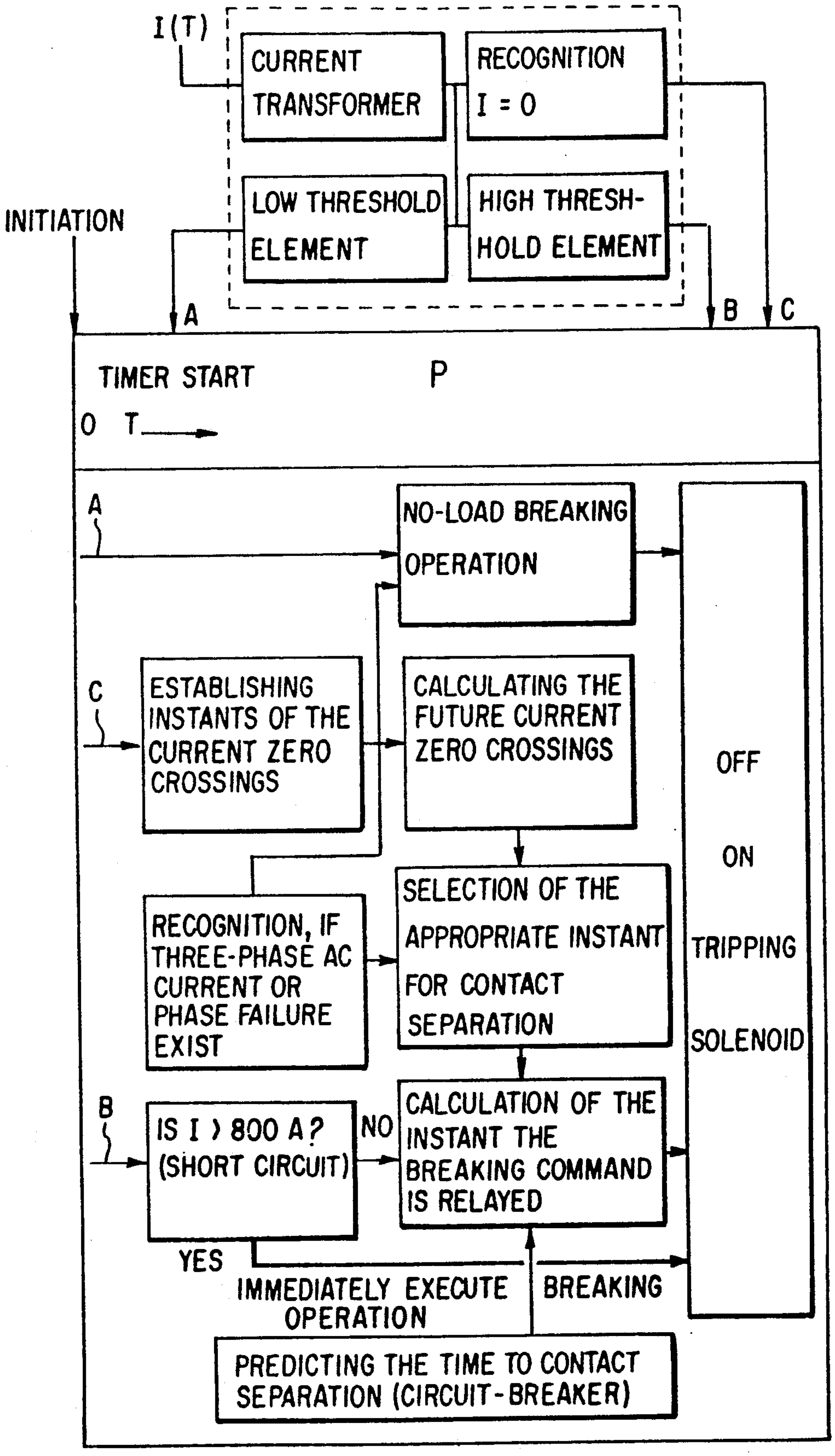
FIG. 6 shows a block diagram of the program run when a circuit-breaker is tripped with the application of a real-time microprocessor.

In FIG. 6, a block diagram of the program run is shown, as it is executed with the help of a real-time microprocessor. The functional sequence is clear from the text entered in the blocks. It is mentioned here, however, that based on the signals transmitted by the current transformers, it is first determined by means of a low threshold element Iu if a very small current exists or if the current lies below a specific low limit. The functional sequence for this case is marked with "A" in the block diagram. Thus, referring to FIG. 6, when the current lies below the lower limit, operation proceeds via path A, where the tripping device operates in No-load breaking operation, i.e., the motor has no load and the circuit break operates in standby. If the measured current lies above a specific limiting value (high threshold element Io), to which value a short circuit can be assigned, the tripping operation follows instantaneously in accordance with the functional sequence designated with B. Operation then proceeds via path B to determine if the current exceeds 800 A (i.e. a short circuit has occurred). If the current exceeds 800 A, then the tripping device trips the solenoids. If not, then operation proceeds to calculating the instant the breaking commands is relayed. The instant that the tripping command is relayed to the tripping solenoids is calculated in the manner as described above for the currents lying between these limiting values.

Under normal conditions, the operation proceeds along path C. First, the current zero crossings are established, which are provided to the no-load breaking operation and to the failure recognition, as well as the calculation of the future current zero crossings. Then, an appropriate instant for contact separation is selected and the instant the break command is transmitted is then determined. As already mentioned above, the so-called opening window for overvoltage-free interruptions in three-phase systems is very narrow. However, if use is made of the possibility of allowing the electric poles of a circuit-breaker to open in a sequenced or staggered fashion and not simultaneously, as is ordinarily the case due to mechanical considerations, the opening window can then be broadened up to about 8.5 msec. Consequently, the demands placed on the accuracy of the mechanical control system and the electronic detection of changes in the tripping delay are mitigated. The method of staggered switching is known per se (DE-C-28 54 092).

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for operating a circuit breaker, comprising the steps of:

a) measuring a tripping delay of the circuit to obtain a measured value of the tripping delay;

b) supplying the measured value of the tripping delay as a first correcting quantity to a tripping control device if a previous opening of the contacts has occurred, wherein said measured value is measured from an instant a tripping signal is output by the tripping device to the instant the contacts are opened;

c) issuing a break command; and d) opening contacts of the circuit breaker at a fixed time relative to a zero crossing of current through the contacts using the tripping control device which is influence by the break command and the measured value.

2. The method according to claim 1, further comprising the step of supplying a temperature of a driving mechanism of the circuit breaker as a second correcting quantity to tripping control device.

3. The method according to claim 1, further comprising the step of supplying a time that has elapsed since the last switching action as a third correcting quantity to the tripping control device.

4. The method according to claim 1, further comprising the step of supplying a supply voltage of a tripping solenoid of the circuit breaker as a fourth correcting quantity to the tripping control device.

5. The method according to claim 1, further comprising the step of supplying a temperature of a winding of a tripping solenoid as a fifth correcting quantity to the tripping control device.

6. The method according to claim 1, further comprising the steps of:

a) receiving an input signal corresponding to the first correcting quantity;

b) comparing said input signal to measured or standard values retrieved from a storage device;

c) preparing a tripping delay signal for the circuit breaker;

d) detecting when a lower limiting value of the current is undershot;

e) detecting when an upper limiting value of the current is exceeded; and f) producing a tripping action for the circuit breaker.

7. An apparatus for breaking a circuit, comprising:

a) a circuit breaker having contacts;

b) a tripping control device coupled to the circuit breaker and initiating an opening of the contacts of the circuit breaker at an instant fixed relative to a zero crossing of a current through the contacts;

c) a means for measuring a tripping delay of the circuit breaker coupled to the circuit breaker and to the tripping control device, wherein said tripping delay is measured from an instant a tripping signal is output to an instant the contacts are opened; and d) a means for supplying the tripping delay as a correcting quantity coupled to said tripping control device.

8. The apparatus according to claim 7, wherein said measuring means further comprises:

a) an evaluator coupled to the circuit breaker, wherein said evaluator is set in operation upon receipt of a tripping signal and stopped upon opening of the contacts; and b) a storage device adapted to store the tripping delay coupled to the evaluator.

9. The apparatus according to claim 8, wherein said evaluator comprises a circuit detecting an arcing between said contacts.

10. The apparatus according to claim 8, wherein said evaluator comprises a circuit measuring the capacitance between said contacts.

11. The apparatus according to claim 7, further comprising a means for detecting a relative movement of said contacts to determine an instant of an opening of said contacts coupled to said tripping control device.

12. The apparatus according to claim 11, wherein said means for detecting a relative movement of said contacts further comprises:

a) a movable contact member having a reflector;
b) a driving element coupled to said movable contact member;
c) an optical waveguide permanently mounted opposite said reflector having a minimal clearance;
d) a light source emitting light towards said reflector; and
e) a receiving circuit for reflected light coupled to said optical waveguide, whereby said optical waveguide receives light from said light source via said reflector.

13. The apparatus according to claim 8, wherein said tripping control device further comprises:

a) a storage device storing measured or standard values of the first correcting quantity;
b) a real-time microprocessor coupled to said storage device receiving input signals corresponding to said first correcting quantity and comparing said input signals to measured values or standard values retrieved from said storage device, and preparing and a delayed tripping signal for said circuit breaker; and
c) a means for detecting when an lower limiting value of the current is undershot and when an upper limiting value of the current is exceeded producing an instantaneous tripping action coupled to said real-time microprocessor.

* * * * *